United States Patent [19]

Petzoldt et al.

[11] Patent Number: 5,300,159
[45] Date of Patent: Apr. 5, 1994

[54] METHOD FOR MANUFACTURING SUPERPLASTIC FORMING/DIFFUSION BONDING TOOLS FROM TITANIUM

[75] Inventors: Michael D. Petzoldt, Chesterfield; Steven M. Sullivan, St. Peters, both of Mo.

[73] Assignee: McDonnell Douglas Corporation, St. Louis, Mo.

[21] Appl. No.: 137,094

[22] Filed: Dec. 23, 1987

[51] Int. Cl.$^5$ .................. C22F 3/00; B32B 15/20
[52] U.S. Cl. .................. 148/525; 148/564; 148/565; 148/669; 148/421; 428/651
[58] Field of Search ............ 148/133, 525, 564, 565, 148/669, 421; 427/383.9; 428/551, 651

[56] References Cited

U.S. PATENT DOCUMENTS

| | | | |
|---|---|---|---|
| 3,045,333 | 7/1962 | Finlay | 427/383.9 |
| 3,329,601 | 7/1967 | Mattox | 204/298.05 |
| 3,765,954 | 10/1973 | Tokuda et al. | 148/133 |
| 4,289,544 | 9/1981 | Dearnaley | 148/133 |
| 4,292,077 | 9/1981 | Blackburn et al. | 148/133 |
| 4,294,615 | 10/1981 | Blackburn et al. | 148/133 |
| 4,568,396 | 2/1986 | Vardiman | 148/133 |
| 4,588,480 | 5/1986 | Thoma | 427/309 |
| 4,681,818 | 7/1987 | Unnam et al. | 428/651 |
| 4,698,244 | 10/1987 | Benander et al. | 427/253 |

FOREIGN PATENT DOCUMENTS

| | | | |
|---|---|---|---|
| 2398118 | 3/1979 | France | 427/383.9 |
| 0066835 | 6/1977 | Japan | 427/383.9 |
| 0870486 | 10/1981 | U.S.S.R. | 427/383.9 |

OTHER PUBLICATIONS

Fannin and Muehlberger, "Ivadizer Applied Aluminum Coating Improves Corrosion Protection of Aircraft", 14th Airlines Plating Forums, Tulsa, Oklahoma; Apr. 25–27, 1978; pp. 1 to 26.
Rao et al., "Reaction and Diffusion between an Al film and . . . " Metall. Trans. A, Jan. 1983, 14A, (1), pp. 61–66.
Teer et al., "The Formation of Low Friction Wear-Resistant . . . " Thin Solid Films, 45(3), 1977 pp. 583–589.
van Loo et al, "Diffusion in the Titanium-Aluminum System-I". . . Acta Met. 21(1), 1973, pp. 73–84.
Ignatov et al, "Structural and Kinetic Investigation of . . . " Titanium and Titanium Alloys, 3rd ed 1976 vol. 2 pp. 1089–1096.
Streiff et al., "Oxidation of aluminide coatings on unalloyed titanium" Chem. abs. 101: 196508t, vol. 101, 1984, p. 270.
Subrahmanyam et al, "High temperature cyclic oxidation of aluminide . . . " Chem. abs. 105: 212831h, vol. 105, 1986, p. 241.
Rieck et al, "Reaction diffusion between two metals including . . . " Chem. abs., 72: 36013g, vol. 72, 1970, p. 351.
Fedorchuk et al., "Oxidation of $\beta$-titanium alloys and their . . . " Chem. abs. 78: 87861p, 1973, vol. 78, p. 235.
Belyaeva et al., "Structure and properties of aluminized titanium" Chem. abs. 85: 24445e, vol. 85, 1976, p. 196.
Streiff et al, "Protection of titanium by aluminide coatings" Chem. abs., 96: 203837h, vol. 96, 1982, p. 267.

*Primary Examiner*—L. Dewayne Rutledge
*Assistant Examiner*—Robert R. Koehler
*Attorney, Agent, or Firm*—Veo Peoples, Jr.

[57] ABSTRACT

A method for manufacturing superplastic forming/diffusion bonding tools and a wide range of other aerospace parts by forming a titanium aluminide interface layer from ion vapor deposition is disclosed.

8 Claims, No Drawings

METHOD FOR MANUFACTURING SUPERPLASTIC FORMING/DIFFUSION BONDING TOOLS FROM TITANIUM

BACKGROUND OF THE INVENTION

The present invention relates to a method for manufacturing tooling for and aerospace parts exposed to elevated temperature conditions in oxidative atmospheres.

Superplastic forming/diffusion bonding (SPF/DB) is a process used to manufacture such items as turbine blades, engine nozzle fairings, titanium sheet metal components and other aerospace components. The finished details of such items are quite complex and intricate in their shape and design. The SPF/DB process may be generally described as a process wherein individual metal components are heated to a certain critical temperature at which they are sufficiently pliable and can be elongated or otherwise formed or molded and joined together, yet will be irreversibly set without structural damage, instability or "necking". It is a convenient alternative for mass producing complex multifacetted metal parts or substrates which would otherwise require their various individual components or subparts to be assembled by cold bending and joined with numerous fasteners. The machinery for this process requires a number of intricate parts, such as machined tool inserts for dimensional accuracy. The base metal of which these machined tool inserts are composed must withstand repeated cycles of temperature elevation ranging from room temperature to over 1600° F., and because of the ambient conditions, are exposed to oxidative conditions which lead to deleterious scaling.

In the past, the tooling inserts for the SPF/DB have been manufactured from stainless steel alloys. Although the stainless steel has resistance to oxidation, when subjected to repeated thermal cycles undesirable spalling and scaling results. It also has had its drawbacks with regard to poor diffusion bonding and its use necessitates costly rework in fabricating SPF/DB materials. This poor diffusion bonding may in part result from the regidity of stainless steel.

A potentially more ductile material of composition for the tool inserts would be a titanium alloy and/or titanium itself. Titanium and its alloys are known to exhibit sufficient flexibility to allow the desired bonding effect. This would be extremely beneficial in manufacturing SPF/DB tooling inserts because the inserts could be fabricated from a thinner block than most steels and hot formed to the required curvatures for the inserts, thus resulting in substantially reduced fabrication costs and far less reworking of materials.

However, in the past, titanium alloy inserts have exhibited a tendency to undergo oxidative degradation and scaling at the elevated temperatures required for SPF/DB. Unless the oxidative scaling is removed after each SPF/DB cycle, subsequent parts may be defective. The scale removal step has been very labor intensive and eventually, the insert may be scrapped if excessive scale removal leads to reduction in the thickness of the tool insert below the required tolerances.

Accordingly, a method for manufacturing the SPF/DB tooling inserts from titanium or titanium alloy without the undesirable oxidative scaling would be a significant advancement in the art. Such a method would also enable the effective use of titanium alloys in a number of aerospace parts, including for example, aircraft turbine blades, access doors, missile details, and other fabricated sheet metal parts, which would be far more effectively manufactured from titanium alloys if the oxidative scaling which occurs at excessively high temperatures could be overcome.

SUMMARY OF THE INVENTION

It is an object of the present invention to provide a method for manufacturing SPF/DB tools from titanium or titanium alloy, which tools may be exposed to excessive temperatures and highly oxidative conditions without undergoing deleterious scaling.

It is further object of the present invention to provide SPF/DB tools which are capable of improved diffusion bonding.

It is also an object of the present invention to provide non-scaling aerospace parts from titanium.

These objects and others which may become readily apparent from the following detailed description are fulfilled by forming SPF/DB machined tool inserts and/or aerospace parts from titanium and forming a titanium aluminide interface layer on said formed tools and/or parts from ion vapor deposition.

DETAILED DESCRIPTION AND PREFERRED EMBODIMENTS

In the process of this invention, detailed SPF/DB tool inserts and aerospace parts are formed from titanium or preferably titanium alloy and a conformal layer of aluminum is deposited under vacuum onto the titanium. The aluminum diffuses into the titanium upon heating, thus forming a barrier layer of titanium aluminide. The process by which the aluminum is deposited is known as ion vapor deposition.

Ion vapor deposition may be generally described as a process for electrostatically depositing a metallic coating onto complex metal substrates uniformly and with excellent adhesion. This technique may be achieved using such equipment as the McDonnell Douglas IVADIZER ®. Therein, the individual substrates are suspended from a rack in a vacuum chamber which is then evacuated and backfilled with inert gas, such as Argon, controlled at low pressure. A highly negative electrostatic potential is applied to the substrate, establishing a glowing ionic discharge of inert gas which surrounds and cleans the substrate surface. The metallic material to be coated onto the substrate is then evaporated from individual reservoirs called "boats" located underneath the substrate. Metal molecules from the boats are accelerated towards the sputtering cleaned substrates by partial ionization from colliding with the ionized inert gas. Coating uniformity is achieved despite the size or complexity in configuration of the substrate. Although, prior to the present invention, ion vapor deposition was used in coating certain stainless steel aerospace parts for a different purpose, it was not believed effective at temperatures any higher than 925° F. See for example, U.S. Pat. No. 3,329,601 and Ivadizer Applied Aluminum Coating Improves Corrosion Protection on Aircraft by E. R. Fannin, et al. for American Electroplaters' Society, 14th Airlines Plating Forum, each being incorporated reference herein.

One previously known method for higher temperature application of aluminum coatings is the hot-dip-and-diffuse technique but lack of control and predictability renders it very difficult to obtain continuous, uniform coatings on items with complicated configurations, and thus is unsuitable for small or intricate aerospace parts and SPF/DB tools. Additionally, the process can be hazardous and is very energy-intensive. Another process, "pack cementation", involves the use of a retort containing the tool or part. A mixture of powdered aluminum is packed around the tool detail together with a ceramic phase and a volatile halide. The process, however, is labor and energy intensive and can be very hazardous. The required packing materials are also expensive and the process generally is unsuitable for large, curved detail parts such as SPF/DB tooling inserts. Other processes include flame, plasma, and/or electric arc spraying methods which leave an undesirable rough coating which lacks uniformity and adhesion. Coating thicknesses of less than 3 mils are difficult to achieve.

More specifically, SPF/DB substrates preferably tool inserts are machined from preferably titanium alloy into intricate curvatures with high dimensional accuracy, having tolerances of ±0.001 inches. Titanium alloys of the invention may be for example, Ti-10V-2Fe-3Al, Ti-6Al-2Sn-4Zr-2Mo, but preferably Ti-6Al-4V. The initial tool fabrication consists of any convenient means including hot forming.

It is then highly desirable to remove all loose surface oxides and any organic contamination from the titanium fabricated tools prior to the ion vapor deposition of aluminum.

The critical surfaces of the tooling insert are then coated with aluminum. These surfaces are defined as critical because of their exposure to atmospheric oxygen at extremely high temperatures. Aluminum alloys such as Aluminum 1200 or Aluminum 1050 may be employed. However, it is preferred to employ for example 1100 Aluminum as the alloy of this invention. Aluminum alloys containing silicon or yttrium can increase the ductility of the diffused coating, and of course, are within the scope of this invention.

The aluminum coating is achieved by ion vapor deposition in for example an IVADIZER ® or other apparatus wherein the individual titanium substrates are loaded at least about 2 inches apart in a vacuum chamber pumped down to preferably less than about $10^{-5}$ Torr. Negative direct current voltage is applied to the substrates resulting in glow discharge cleaning. Aluminum alloy, preferably aluminum 1100 is vaporized from individual electrically heated crucibles or boats underneath the titanium substrates resulting in uniform coating and thereafter cooled, allowing the chamber to vent.

The coated tooling insert is heated to temperatures of from about 1200° F. to about 1700° F. for one half to about three hours. This heating should be sufficient to cause an eutectic reaction or interdiffusion between an aluminum-rich and a titanium-rich layer, which results in an interface layer of, for example, $Ti_3Al$, $TiAl$, $TiAl_3$, or other stable forms of titanium aluminide.

The remaining aluminum-rich layer may be left in place or may be removed by caustic etching or even by mechanical means. In either case, the resulting tool detail will be resistant to hot oxidation (scaling), and still retain a high degree of ductility.

In addition to producing improved tool inserts and, for example, bladders, the process of this invention can also be utilized in the manufacture and/or repair of hot oxidation-resistant titanium parts for the hot section of aerospace engines, including combustor swirlers, vanes, and inner turbine stator support structures. The advantages of this invention are that titanium aluminides have low density, good elevated temperature properties, and do not ignite. By fabricating the details with titanium alloy and then forming protective aluminide layers, the problems of producing titanium aluminide ingots and forging the same are avoided. Accordingly, the present invention may be used wherever lightweight, high temperature oxidation resistant details of tooling or part assembly are desired.

EXAMPLE 1

A large forming tool for a superplastic forming titanium press is fabricated out of titanium. The tool is used to fabricate panels for the McDonnell Douglas F-15E airplane. It is observed that the tool scales at 1600° to 1700° F. This scale must be removed after each run, and when this is not done, subsequent parts are dimpled or out of tolerance.

The forming tool of Example 1 is ion vapor deposited with 1100 aluminum alloy to a coating depth of 0.001". At the SPF temperatures of 1600° to 1700° F., no scale is observed on the tool, and parts are formed without any dimpled or out of tolerance surfaces. The first 3 parts made with the coated forming tool were within specifications and well bonded. Also, no rework or cleaning was needed on the tool between runs.

EXAMPLE 2

Ti-6Al-4V test panels were coated in the following manner:

Samples A and B were coated with less than 0.5 mils ion vapor deposited aluminum.

Samples C and D were coated with 2 mils ion vapor deposited aluminum.

Sample E was not coated.

The above panels were heated in air at 1650° for one hour and then air cooled.

The uncoated panel exhibited severe oxidation (scaling).

The coated panels exhibited a light, white powder, on their surface, but no scaling. Panels B and D were cycled nine additional times in air at 1650° F. for one hour and air cooled. No scaling was exhibited, though sample B exhibited slight discoloration.

All of the above panels had a dimensional accuracy of ±0.001".

We claim:

1. A method for manufacturing superplastic forming-/diffusion bonding tooling, comprising;
   a) forming said tools from metal selected from the group consisting of titanium and titanium alloys;
   b) coating said tools by ion vapor deposition with a thin conformal layer of a material selected from the group consisting of aluminum and aluminum alloys;
   c) heating said coated tool sufficiently to cause an eutectic reaction interdiffusing the aluminum and the titanium layers, resulting in a titanium aluminide interface between the aluminum and the titanium; whereby, said tools may be exposed to elevated temperatures and oxidative atmospheres without exhibiting oxidation-degradative scaling, and whereby said tool will exhibit improved diffusion bonding.

2. The method of claim 1 wherein the aluminum layer is removed by caustic etching or mechanical means in order to expose the titanium aluminide layer.

3. The methods of claims 1 or 2 wherein loose surface oxides and other organic contamination are removed from the titanium fabricated tool prior to ion vapor deposition.

4. The methods of claims 1 or 2 wherein the coated tool is heated to a temperature of from about 1200° F. to about 1650° F.

5. The methods of claims 1, 2 wherein the coated tool is heated for from about 0.5 to about 3.0 hours.

6. The methods of claims 1 or 2 wherein the aluminum alloy is 1100 aluminum.

7. A method for making aerospace parts, comprising;
 a) molding said parts from metal selected from the group consisting of titanium and titanium alloys;
 b) coating said parts by ion vapor deposition of a thin conformal layer of a material selected from the group consisting of aluminum and aluminum alloys;
 c) Heating said coated part sufficiently to cause an eutectic reaction interdiffusing the aluminum and the titanium layers, resulting in a titanium aluminide interface between the aluminum and the titanium; whereby, said parts may be exposed to elevated temperatures and oxidative atmospheres without exhibiting oxidation-degradative scaling.

8. The product prepared by the process of claims 1 or 2.

* * * * *